(12) United States Patent
Divsalar et al.

(10) Patent No.: US 8,086,943 B2
(45) Date of Patent: *Dec. 27, 2011

(54) SERIAL TURBO TRELLIS CODED MODULATION USING A SERIALLY CONCATENATED CODER

(75) Inventors: Dariush Divsalar, Pacific Palisades, CA (US); Samuel J. Dolinar, Sunland, CA (US); Fabrizio Pollara, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/848,889

(22) Filed: Aug. 2, 2010

(65) Prior Publication Data

US 2010/0299581 A1    Nov. 25, 2010

Related U.S. Application Data

(60) Division of application No. 11/514,295, filed on Aug. 31, 2006, now Pat. No. 7,770,093, which is a continuation of application No. 09/760,514, filed on Jan. 11, 2001, now Pat. No. 7,243,294.

(60) Provisional application No. 60/176,404, filed on Jan. 13, 2000.

(51) Int. Cl.
H03M 13/03    (2006.01)

(52) U.S. Cl. .......................... 714/794; 714/795

(58) Field of Classification Search .................. 714/794, 714/795
See application file for complete search history.

(56) References Cited

U.S. PATENT DOCUMENTS

| | | | | |
|---|---|---|---|---|
| 4,941,154 A | | 7/1990 | Wei | |
| 5,583,889 A | | 12/1996 | Citta et al. | |
| 5,841,818 A | * | 11/1998 | Lin et al. | 375/341 |
| 6,023,783 A | * | 2/2000 | Divsalar et al. | 714/792 |
| 6,029,264 A | | 2/2000 | Kobayashi et al. | |
| 6,202,189 B1 | * | 3/2001 | Hinedi et al. | 714/786 |
| 6,298,461 B1 | * | 10/2001 | Tong et al. | 714/755 |
| 6,308,294 B1 | * | 10/2001 | Ghosh et al. | 714/751 |
| 6,473,878 B1 | | 10/2002 | Wei | |
| 6,629,287 B1 | * | 9/2003 | Brink | 714/755 |
| 6,662,337 B1 | * | 12/2003 | Brink | 714/792 |
| 6,754,290 B1 | * | 6/2004 | Halter | 375/340 |
| 6,795,507 B1 | * | 9/2004 | Xin et al. | 375/265 |
| 7,089,477 B1 | | 8/2006 | Divsalar et al. | |

(Continued)

OTHER PUBLICATIONS

Benedetto, S.; Divsalar, D.; Montorsi, G.; Pollara, F.; "Serial concatenation of interleaved codes: performance analysis, design, and iterative decoding", IEEE Transactions on Information Theory, vol. 44, Issue 3, May 1998 pp. 909-926.*

(Continued)

*Primary Examiner* — Joseph D Torres

(57) ABSTRACT

Serial concatenated trellis coded modulation (SCTCM) includes an outer coder, an interleaver, a recursive inner coder and a mapping element. The outer coder receives data to be coded and produces outer coded data. The interleaver permutes the outer coded data to produce interleaved data. The recursive inner coder codes the interleaved data to produce inner coded data. The mapping element maps the inner coded data to a symbol. The recursive inner coder has a structure which facilitates iterative decoding of the symbols at a decoder system. The recursive inner coder and the mapping element are selected to maximize the effective free Euclidean distance of a trellis coded modulator formed from the recursive inner coder and the mapping element. The decoder system includes a demodulation unit, an inner SISO (soft-input soft-output) decoder, a deinterleaver, an outer SISO decoder, and an interleaver.

20 Claims, 5 Drawing Sheets

U.S. PATENT DOCUMENTS

| | | | |
|---|---|---|---|
| 7,243,294 B1* | 7/2007 | Divsalar et al. | 714/792 |
| 7,770,093 B2* | 8/2010 | Divsalar et al. | 714/794 |
| 2007/0130494 A1* | 6/2007 | Divsalar et al. | 714/755 |

OTHER PUBLICATIONS

Benedetto S.; Divsalar D.; Garello R.; Montorsi G.; Pollara F., Bit geometrically uniform encoders: a systematic approach to the design of serially concatenated TCM, Proceedings Information Theory Workshop 1998.*

Stephen B. Wicker, Error Control Systems for Digital Communication and Storage, Prentice-Hall, 1995, pp. 356-373.*

Benedetto, S.; Divsalar, D.; Montorsi, G.; Pollara, F.; Parallel concatenated trellis coded modulation; IEEE International Conference on Communications, vol. 2, Jun. 23-27, 1996 pp. 974-978.*

Stephen B. Wicker, "Error Control Systems for Digital Communication and Storage", Prentice-Hall, 1995 pp. 360-369.

Benedetto, S.; Divsalar, D.; Montorsi, G.; Pollara, F; Serial concatenation of interleaved codes: performance analysis, design, and iterative decoding; IEEE Transactions on Information Theory, vol. 44, Issue 3, May 1998 pp. 909-926.

Benedetto, S.; Divsalar, D.; Montorsi, G.; Pollara, F.; Parallel concatenated trellis coded modulation; IEEE International Conference on Communications, vol. 2, Jun. 23-27, 1996 pp. 974-978.

Effective Free Distance of Turbo Codes, .Copyrgt. IEE 1996, Jan. 3, 1996, Electronics Letters Online No: 19960321, Electronics Letters, p. 445, vol. 32, No. 5, Feb. 29, 1996, D. Divsalar and R.J. McEliece.

Official Action in U.S. Appl. No. 09/760,514 dated Jun. 24, 2003, 16 pages.

Response to Official Action in U.S. Appl. No. 09/760,514 dated Jun. 24, 2003 mailed Nov. 28, 2003,15 pages.

Official Action in U.S. Appl. No. 09/760,514 dated Dec. 24, 2003, 12 pages.

Response to Official Action in U.S. Appl. No. 09/760,514 dated Dec. 24, 2003 mailed Jun. 23, 2004, 10 pages.

Official Action in U.S. Appl. No. 09/760,514 dated May 4, 2005, 8 pages.

Response to Official Action in U.S. Appl. No. 09/760,514 dated May 4, 2005 mailed Nov. 10, 2005, 11 pages.

Official Action in U.S. Appl. No. 09/760,514 dated Dec. 28, 2005, 10 pages.

Response to Official Action in U.S. Appl. No. 09/760,514 dated Dec. 28, 2005 mailed Jun. 29, 2006, 25 pages.

Official Action in U.S. Appl. No. 09/760,514 dated Aug. 15, 2006, 12 pages.

Response to Official Action in U.S. Appl. No. 09/760,514 dated Aug. 15, 2006 mailed Dec. 20, 2006, 12 pages.

Divsalar, et al., Coding Theorems for "Turbo-Like" Codes, Proc. 1998 Allerton Conference, Sep. 23-25, 1998, pp. 210-210.

Benedetto, et al., "Serial Concatenated Trellis Coded Modulation with Iterative Decoding: Design and Performance", IEEE Global Telecommunications Conference (CTMC), Nov. 1997 ("CTMC97").

Benedetto, et al., "Serial Concatenated Trellis Coded Modulation with Iterative Decoding: Design and Performance", Nov. 4, 1997, JPL TRP 1992+, accessible from http://trs-new.jpl.nasa.gov/dspace/bitstream/2014/22922/1/97/1466.pdf.

Ungerboeck, Gottfried, "Channel Coding with Multilevel/Phase Signals", IEEE Transactions on Information Theory, vol. IT-28, No. 1, Jan. 1982.

Forney, G. David, "Concatenated Codes", NASA Technical Report 440, Dec. 1, 1965, available at http://dspace.mit.edu/bitstream/handle/1721.1/4303/RLE-TR-440-04743368.pdf;jsessionid=D17E3F7616BCCD69D1374E06C6DF6947?sequence=1.

Berrou, et al., "Near Shannon Limit Error-Correcting Coding: Turbo Codes," Proc. 1993 IEEE International Conf on Communications, Geneva, pp. 1064-1070, May 1993.

Divsalar, et al., "On the Design of Turbo Codes," JPL TMO Progress Report 42-123, Nov. 15, 1995.

Benedetto, et al., "Unveiling Turbo Codes: some results on parallel concatenated coding schemes," IEEE Trans on Inf. Theory, Mar. 1996.

Legoff et al., "Turbo Codes and High Spectral Efficiency Modulation," Proceedings of IEEE ICC'94, May 1-5, 1994, New Orleans, LA.

Benedetto, et al., A Soft-Input Soft Output Maximum A Posteriori (MAP) Module to Decode Parallel and Serial Concatenated Codes, TDA Progress Report, Nov. 15, 1996, accessible from http://tmo.jpl.nasa.gov.

Divsalar, et al., "Hybrid Concatenated Codes and Iterative Decoding," TDA Progress Report 42-130, Aug. 15, 1997, accessible from http://tmo.jpl.nasa.gov.

Benedetto et al., "Soft-Output Decoding Algorithms in Iterative Decoding of Turbo Codes," TDA Progress Report 42-124, Feb. 15, 1996, accessible from http://tmo.jpl.nasa.gov.

Wachsmann, et al., Power and Bandwidth Efficient Digital Communication Using Turbo Codes in Multilevel Codes, European Transactions on Telecommunications, vol. 6, No. 5, Sep./Oct. 1995, pp. 557-567.

"Signal Processing for Wireless Communications" by Joseph Boccuzzi, published by McGraw-Hill, 2008 ( "Boccuzzi"): p. 242, lines 4-10; p. 232.

"Satellite Communication Systems Design," edited by Sebastiano Tirró ("Tirró"), Springer 1993, p. 487.

"Introduction to Convolutional Codes with Applications," A. Dholakia, Springer 1994 ("Dholakia"): p. 20, lines 2-5.

Systematic Code at http://en.wikipedia.org/wiki/Systematic_code, Dec. 3, 2008.

"A Comparison of Several Strategies for Iteratively Decoding Serially Concatenated Convolutional Codes in Multipath Rayleigh Fading Environment," Berthet et al., Global Telecommunications Conference, 2000 (GLOBECOM '00 IEEE), San Francisco, CA, vol. 2, pp. 783-789, Nov. 27, 2000-Dec. 1, 2000, accessible from http://ieeexplore.ieee.org/xpls/abs_all.jsp?tp=&arnumber=891246&isnumber=19260.

"Serial Concatenated Trellis Coded Modulation with Rate-1 Inner Code", Divsalar et al., Sep. 7, 2000, downloaded from http://trs-new.jpl.nasa.gov/dspace/handle/2014/16146.

S. Benedetto and G. Montorsi, "Iterative Decoding of Serially Concatenated Convolutional Codes", Electronics Letters, Jun. 20, 1996, pp. 1186-1188, vol. 32, No. 13.

S. Benedetto and G. Montorsi, "Serial Concatenation of Block and Convolutional Codes", Electronics Letters, May 9, 1996, pp. 887-888, vol. 32, No. 10.

S. Benedetto, D. Divsalar, G. Montorsi, and F. Pollara, "Serial Concatenation of Interleaved Codes: Performance Analysis, Design, and Iterative Decoding", Jet Propulsion Laboratory, California Institute of Technology, TDA Progress Report 42-126, Aug. 15, 1996.

A.O. Berthet, R. Visod, B. Unal, P. Tortelier; A Comparison of Several Strategies for Iteratively Decoding Serially Concatenated Convolutional Codes in Multipat h Rayleigh Fading Environment; IEEE, 2000, pp. 783-789.

Benedetto S.; Divsalar D.; Garello R.; Montorsi G.; Pollara F., Bit geometrically uniform encoders: a systematic approach to the design of serially concatenated TCM, Proceedings Information Theory Workshop 1998.

Official Action in U.S. Appl. No. 11/514,295 dated Jul. 19, 2007, 20 pages.

Response to Official Action in U.S. Appl. No. 11/514,295 dated Jul. 19, 2007 mailed Dec. 14, 2007, 13 pages.

Official Action in U.S. Appl. No. 11/514,295 dated Jan. 15, 2008, 18 pages.

Response to Official Action in U.S. Appl. No. 11/514,295 dated Jan. 15, 2008 mailed Apr. 29, 2008, 13 pages.

Official Action in U.S. Appl. No. 11/514,295 dated Jun. 1, 2009, 12 pages.

Response to Official Action in U.S. Appl. No. 11/514,295 dated Jun. 1, 2009 mailed Oct. 9, 2009, 14 pages.

Official Action in U.S. Appl. No. 11/514,295 dated Dec. 7, 2009, 16 pages.

Response to Official Action in U.S. Appl. No. 11/514,295 dated Dec. 7, 2009 mailed Feb. 8, 2010, 13 pages.

* cited by examiner

SERIAL TURBO TRELLIS CODED MODULATION USING A SERIALLY CONCATENATED CODER

CROSS REFERENCE TO RELATED APPLICATIONS

This application is a continuation of U.S. application Ser. No. 11/514,295, entitled "Serial Turbo Trellis Coded Modulation Using A Serially Concatenated Coder," filed Aug. 31, 2006, which in turn is a continuation of U.S. application Ser. No. 09/760,514, entitled "Serial Turbo Trellis Coded Modulation Using a Serially Concatenated Coder," filed Jan. 11, 2001, which claims the benefit of U.S. Provisional Application No. 60/176,404, filed on Jan. 13, 2000.

STATEMENT AS TO FEDERALLY-SPONSORED RESEARCH

The invention described herein was made in the performance of work under a NASA contract, and is subject to the provision of Public Law 96-517 (U.S.C. 202) in which the Contractor has elected to retain title.

BACKGROUND

Properties of a channel affect the amount of data that can be handled by the channel. The so-called "Shannon limit" defines the theoretical limit of amount of data that a channel can carry.

Different techniques have been used to increase the data rate that can be handled by a channel. "Near Shannon Limit Error-Correcting Coding and Decoding: Turbo Codes," by Berrou et al. ICC, pp 1064-1070, (1993), described a new "turbo code" technique that has revolutionized the field of error correcting codes.

Turbo codes have sufficient randomness to allow reliable communication over the channel at a high data rate near capacity. However, they still retain sufficient structure to allow practical encoding and decoding algorithms. Still, the technique for encoding and decoding turbo codes can be relatively complex.

A standard turbo coder is shown in FIG. 1. A block of k information bits 100 is input directly to a first encoder 102. A k bit interleaver 110 also receives the k bits and interleaves them prior to applying them to a second encoder 104. The second encoder produces an output that has more bits than its input, that is, it is a coder with rate that is less than 1. The encoders 102, 104 are also typically recursive convolutional coders.

Three different items are sent over the channel 150: the original k bits 100, first encoded bits 111, and second encoded bits 112.

At the decoding end, two decoders are used: a first constituent decoder 160 and a second constituent decoder 162. Each receives both the original k bits, and one of the encoded portions 110, 112. Each decoder sends likelihood estimates of the decoded bits to the other decoders. The estimates are used to decode the uncoded information bits as corrupted by the noisy channel.

Turbo codes are effectively parallel concatenated codes with an encoder having two or more constituent coders joined through one or more interleavers. Input information bits feed the first encoder, are scrambled by the interleaver, and enter the second encoder. A code word is formed by a parallel concatenated code formed by the input bits to the first encoder followed by the parity check bits of both encoders.

Trellis coded modulation is described in "Channel Coding with Multilevel Phase Signaling", Ungerboeck, IEEE Trans Inf. Th. Vol. IT-25, pp 55-67, January 1982. Trellis coded modulation can produce significant coding gains in certain circumstances.

In some situations it may be desirable to have a very low bit error rate, e.g. less than $10^{-9}$.

SUMMARY

The present application combines a combination of trellis coded modulation with turbo codes, to obtain certain advantages of bandwidth and power efficiency from the trellis coded modulation, while also obtaining other advantages of the turbo codes. A specific embodiment combines serially concatenated coding for the inner coder with trellis codes on the outer coder.

BRIEF DESCRIPTION OF THE DRAWINGS

These and other aspects of the invention will be described in detail with reference to the accompanying drawings, wherein.

DETAILED DESCRIPTION

A disclosed embodiment uses serially concatenated codes with Trellis codes, to obtain low error floors and obtain the advantages of iterative coding as it is often used in a parallel concatenated code.

In a "classical" concatenated coding system, an interleaver is placed between inner and outer coders to separate bursts of errors produced by the inner encoder. In contrast, the serially concatenated coder described herein may optimize the inner and outer coders and the interleaver as a single entity thereby optimizing the whole serial structure. This has not been done in the past due to complexity and the difficulty of optimum coding.

The present application may use the technology of the uniform interleaver as described in "unveiling turbo codes: some results on parallel concatenated coding schemes", S. Benedetto, et al, IEEE TRANS of Inf Theory March 1996. The uniform interleaver allows setting criteria which optimize the component codes in order to construct more powerful serially concatenated codes with a relatively large block size.

The complexity of the coding is handled herewith using sub optimum iterative decoding methods. The concatenation of an outer convolutional code or a short block code with an inner trellis coded modulation code is called a serially concatenated TCM code. This system enables a relatively very low bit error rate.

Figure 1:
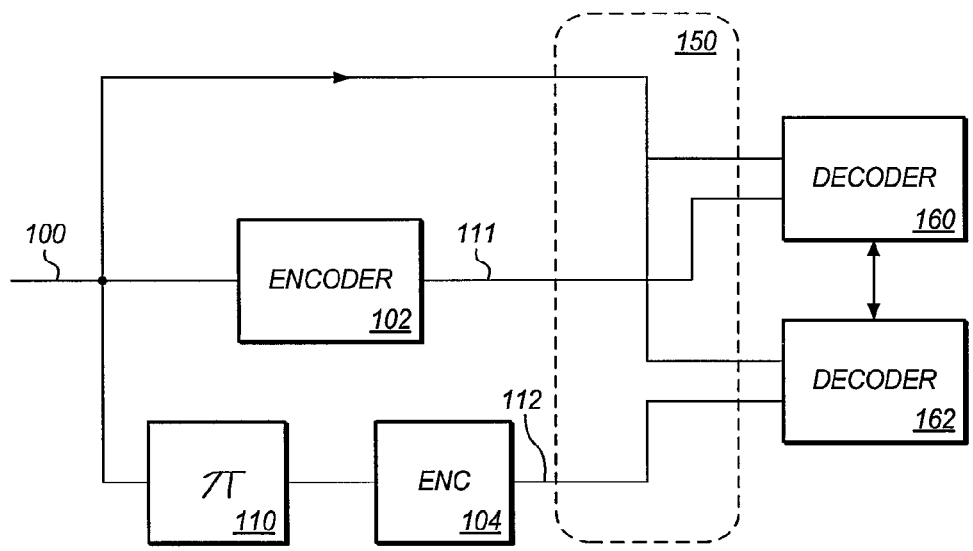
FIG. 1 shows a block diagram of a prior art turbo coder.
Figure 2:
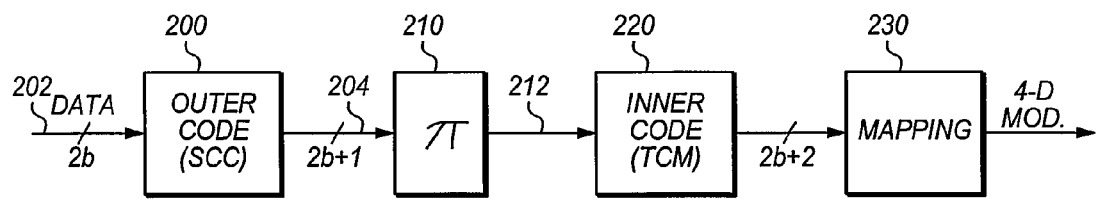
FIG. 2 shows a block diagram of inner coder for serially concatenated trellis coded modulation using a generic mapper.

FIG. 2 shows the basic structure of the serially concatenated trellis coded modulation scheme. The outer coder, which is a serial concatenated coder 200, receives input data 202 having 2b bits, and produces output data 204 having 2b+1 bits. Hence, the outer coder 200 has a rate 2b/(2b+1). More generally, however, the coder should have a rate somewhat less than one. A short block code can alternatively be used as long as it has maximum free Hamming distance as the outer code.

An interleaver Π 210 permutes the output of the outer coder 200. This produces interleaved data 212. The interleaved data 212 enters an inner coding block 220 which is a recursive, convolutional inner coder having rate (2b+1)/(2b+2). Mapper 230 then maps the 2b+2 output bits of the inner coder 220 to two symbols. Each symbol belongs to a $2^{b+1}$ level modulation or four dimensional modulation. This system uses 2b information bits for each two modulation symbol intervals, thereby resulting in a b bit/second/Hz transmission when ideal Nyquist pulse shaping is used. In other words, this provides b bits per modulation symbol. The inner code and the mapping are jointly optimized based on maximum effective free Euclidean distance of the inner trellis coded modulation, as described above.

There are many different ways of configuring two-dimensional and multidimensional trellis coded modulators. Conventional trellis coded modulator designs may have drawbacks when used in this situation. Therefore, while the present application contemplates using conventional trellis coded modulators, it is noted that there are reasons why such conventional modulators may be less useful.

In a serial trellis coded modulator, the Euclidean distance of encoded sequences can be very large for input sequences having a Hamming distance equal to one. This may not be satisfied even if the encoder structure has feedback. Some of the input bits may remain uncoded in a conventional trellis coded modulator. These uncoded bits may select a point from among a set that has been chosen according to the encoded bits. The combination of coded and uncoded bits is then mapped to either two or higher dimensional modulation.

It has been considered by the present inventors to use conventional trellis coded modulation without parallel branches. This, however, may require that the number of states be greater than the number of transition per states. This in turn may prevent the use of simple codes with a small number of states.

Conventional trellis coded modulators also assign the input labels effectively arbitrarily. It has been thought by many that the assignment of input labels did not play an important role in coding. According to the present specified coding system, input labels are carefully selected.

Another aspect is the complexity of the code selection. The serially concatenated trellis coded modulation described with reference to FIG. 2 has a number of transitions per state of $2^{2b+1}$. For specific case of interest, b may equal 3. Therefore, even if the number of states is low, the number of transitions may be high. For two states, there still may be 128 transitions per state, resulting in 256 edges in the trellis section. The complexity of the decoder may depend on the number of edges per trellis section. This complexity as described above may actually interfere with high-speed operation, since the complexity of operation takes time to complete.

Figure 3:
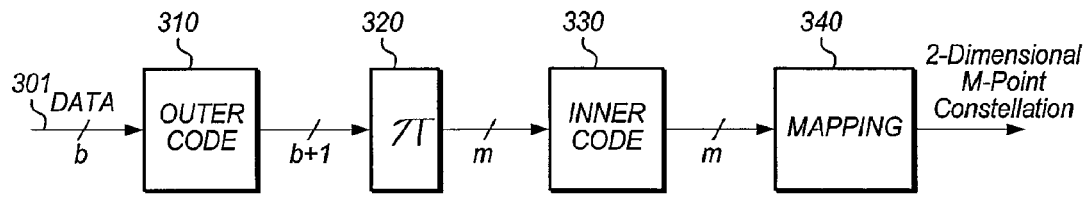
FIG. 3 shows a block diagram of an inner coder using two-dimensional M point mapping.

Another serial concatenated trellis coded modulation scheme is shown in FIG. 3. This system uses a two-dimensional constellation with M points. For purposes of explanation, we can define m=log 2M, where M is the number of phases. In this structure, the input data 300 is coupled to an outer coder 310 producing b+1 bits for the b input bits. Hence, the outer coder is a rate b/b+1 binary convolutional coder. An interleaver 320 permutes the output of the outer coder. The interleaved data enters a rate m/m=1 recursive convolutional inner coder. The m output bits are then mapped to one symbol along into a $2^m$ level modulation by a mapping element 340. This system uses b information bits per b+1/m modulation symbol interval. It effectively results in bm/b+1 bits per modulation symbol.

The inner coder 330 and mapping 340 are jointly optimized based on maximization of the effective free Euclidean distance of the inner trellis coded modulator.

For example consider 8 PSK modulation, where m=3. Then, the throughput r=3b/(b+1) is as follows: for b=2, r=2; for b=3, r=2.25; and for b=4, r=2.4. Accordingly, a ½ convolutional code with puncturing can be used to obtain various throughput values, without changing the inner coder modulation.

A ½ convolutional code with puncturing can be used to obtain various throughput values, without changing the inner coder modulation.

For rectangular $M^2$-QAM, where m=$\log_2$ M, the structure may become even simpler. In this case, to achieve throughput of 2 mb/(b+1) bps/Hz a rate b/(b+1) outer coder and a rate m/m inner coder may be used, where the m output bits are alternatively assigned to in-phase and quadrature components of the $M^2$-QAM modulation.

Figure 4:
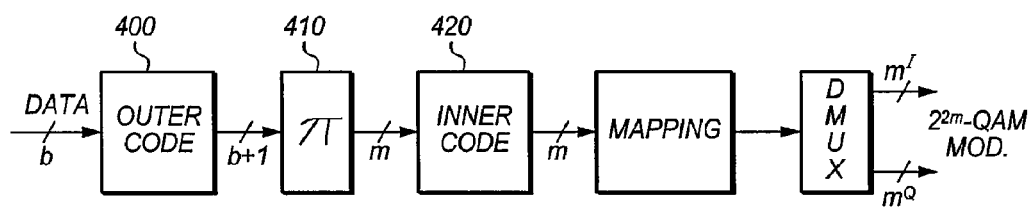
FIG. 4 shows a coder using a mapping system that provides trellis coded modulation for QAM.

The structure of the SCTCM encoder is shown in FIG. 4. An outer coder 400 is connected to an interleaver 410, which drives a trellis code modulator inner coder 420.

For example consider 16-QAM modulation, where m=2, then the throughput r=4b/(b+1) is: for b=1, r=2; for b=2, r=2.67; for b=3, r=3; and for b=4, r=3.2.

For this embodiment, b=r=3. This causes the number of transitions per state of the inner TCM 420 to be reduced to 4. This results in a large reduction in complexity: 32 times lower than the previous case. Moreover, the outer coder also has a lower code rate; this code rate may be reduced from 6/7 to ¾.

Figure 5:
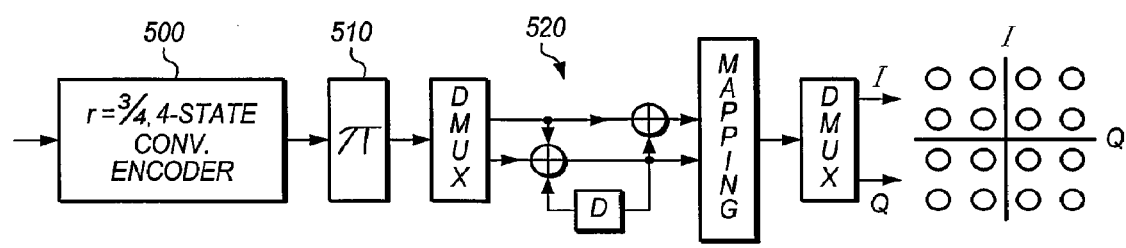
FIG. 5 shows a trellis coded modulator which has an inner coder formed of a two state device.

Other embodiments of this basic idea are also possible by changing the mapping. In the FIGS. 5 and 6 embodiments, the output of the inner coder is mapped to the I and Q components of 16QAM alternatively. The encoder structure of a SCTCM for 2-state inner TCM is shown in FIG. 5, which shows the rate ¾ four state coder 500 operating as the outer coder. An interleaver 510 drives the inner coder 520.

Figure 6:
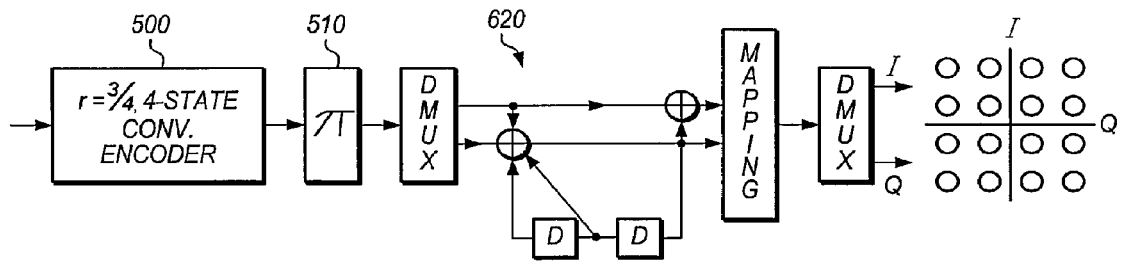
FIG. 6 shows a trellis coder with a four state trellis coded modulator.

The encoder structure of SCTCM for 4-state inner TCM is shown in FIG. 6. The inner coder 620 includes two delay elements as shown. The outer coder 500 has an optimum rate ¾, 4-state nonrecursive convolutional code with free Hamming distance of 3.

Figure 7:
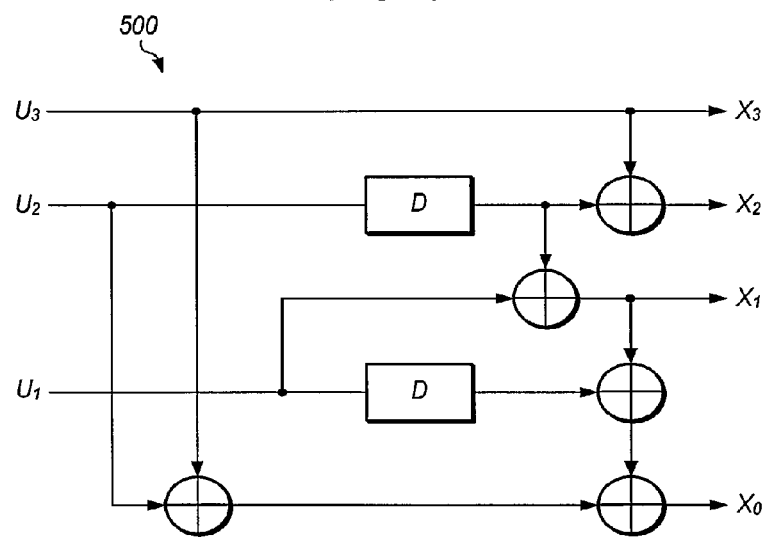
FIG. 7 shows an outer coder for use in the FIGS. 5 and 6 embodiments.

The detailed structure of the outer encoder 500 is shown in FIG. 7. This rate ¾, 4-state outer code has 32 edges per trellis section and produces 4 output bits. Thus the complexity per output bit is 32/4=8. The complexity per input bit is 32/3.

Figure 8:
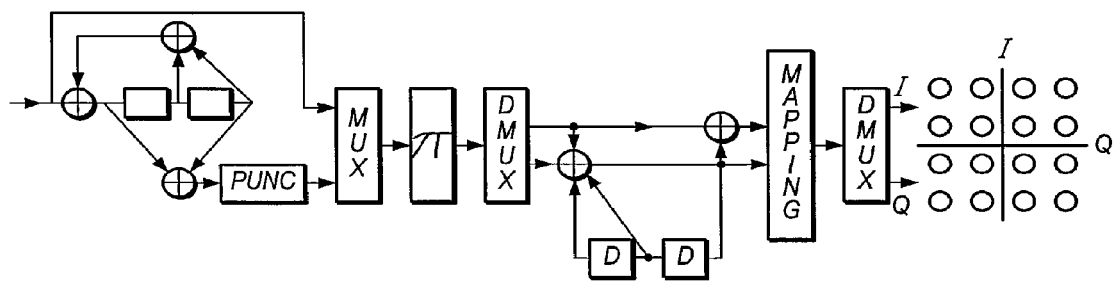
FIG. 8 shows an alternative embodiment using bit puncturing.

The complexity of the outer coder may be further reduced using a rate of ½, 4-state systematic recursive convolutional code. This code can be punctured to rate ¾, by puncturing only the parity bits. The minimum distance of this punctured code is 3, the same as for the optimum code. Now the code has 8 edges per trellis section and produces 2 output bits. Thus the complexity per output bit is 8/2=4. Since this code is systematic there is no complexity associated with the input. The encoder structure for this low complexity SCTCM is shown in FIG. 8.

Using this low complexity scheme with 5 iterations is roughly equal to the complexity of a standard Viterbi decoder However, this obtains a 2 db advantage over the "Pragmatic" TCM system.

It can be shown that a dominant term in the transfer function bound on bit error probability of serially concatenated TCM, employing an outer code with free (or minimum) Hamming distance $d_f^0$, averaged over all possible interleavers of N bits, is proportional for large N to $$N^{-\lfloor (d_f^0+1)/2 \rfloor} e^{-\delta^2 E_S/4N_0}$$

Where $\lfloor x \rfloor$ represents, the integer part of x, and $$\delta^2 = \frac{d_f^0 d_{f,eff}^2}{2}, \text{ for } d_f^0 \text{ even, and}$$

$$\delta^2 = \frac{(d_f^0-3)d_{f,eff}^2}{2} + (h_m^{(3)})^2, \text{ for } d_f^0 \text{ odd}$$

The parameter $d_{f,eff}$ is the effective free Euclidean distance of the inner code, $h_m^{(3)}$ the minimum Euclidean distance of inner code sequences generated by input sequences with Hamming distance 3, and $E_s/N_0$ is the M-ary symbol signal-to-noise-ratio.

The above results are valid for very large N. On the other hand, for large values of the signal-to-noise ratio $E_s/N_o$, the performance of SCTCM is dominated by $$N^{-l_m(h_m)-1} e^{-h_m^2(E_S/4N_0)}$$

where $h_m$ is the minimum Euclidean distance of the SCTCM scheme, and $l_m(h_m) \geq d_f^0$.

Based on these results, the design criterion for serially concatenated TCM for larger interleavers and very low bit error rates is to maximize the free Hamming distance of the outer code (to achieve interleaving gain), and to maximize the effective free Euclidean distance of the inner TCM code.

Let z be the binary input sequence to the inner TCM code, and x(z) be the corresponding inner TCM encoder output with M-ary symbols. The present application defines criteria for selecting the constituent inner TCM encoder:
 1. The constituent inner TCM encoder may be configured for a given two or multidimensional modulation such that the minimum Euclidean distance d(x(z), x(z')) over all z, z' pairs, z≠z' is maximized given that the Hamming distance $d_H(z, z')=2$. We call this minimum Euclidean distance the effective free Euclidean distance of the inner TCM code, $d_{f,eff}$.
 2. If the free distance of outer code $d_f^0$ is odd, then, among the selected inner TCM encoders, choose those that have the maximum Euclidean distance d(x(z),x(z')) over all z, z'pairs, z≠z', given that the Hamming distance $d_H(z, z')=3$. This value is the minimum Euclidean distance of the inner TCM code due to input Hamming distance 3, denoted by $h_m^{(3)}$.
 3. Among the candidate encoders, select the one that has the largest minimum Euclidean distance in encoded sequences produced by input sequences with Hamming distance $d_f^0$. This minimum Euclidean distance of the SCTCM is called $h_m$.

It has been found by the inventors that that sequences with Hamming distances of 2 or 3 at the input of the TCM encoder are still important, even if the free Hamming distance $d_f^0$ of the outer code is larger than 2 or even 3. This is because the interleaving gain at low signal to noise ratios may depend on the number of error events that a pair of input sequences generate in the trellis of the inner code. For a given input Hamming distance, a larger number of error events may create a smaller interleaving gain. For example, if the input Hamming distance between sequences to the inner TCM is 4, the largest number of error events that produce small output Euclidean distances is 2 (two events with an input Hamming distance of 2 each).

As described above, the present embodiments also use mapping of output labels for TCM. As soon as the input labels and output signals are assigned to the edges of a trellis, a complete description of the TCM code is obtained. The selection of the mapping (output labels) does not change the trellis code. However, it influences the encoder circuit required to implement the TCM scheme. A convenient mapping should be selected to simplify the encoder circuit and, if possible, to yield a linear circuit that can be implemented with exclusive Ors. The set partitioning of the constellation and the assignment of constellation points to trellis edges, and the successive assignments of input labels to the edges may be important. Ungerboeck proposed a mapping called "Mapping by set partitioning", leading to the "natural mapping". This mapping for two-dimensional modulation may be useful if one selects the TCM scheme by searching among all encoder circuits that maximize the minimum Euclidean distance.

The "inner" trellis code modulator can be configured as follows:
 The well known set partitioning techniques for signal sets may be used.
 The input label assignment is based on the codewords of the parity check code (m, m−1, 2) and the set partitioning, to maximize the quantities described in the equations above. The minimum Hamming distance between input labels for parallel transitions will be equal to 2. The assignment of codewords of the parity check code as input labels to the two-dimensional signal points is not arbitrary.
 A sufficient condition to have very large output Euclidean distances for input sequences with Hamming distance 1 is that all input labels to each state be distinct.
 A pair of input labels and two-dimensional signal points are assigned to the edges of a trellis diagram based on the design criteria described above.

Example 1

Set Partitioning of 8PSK and Input Labels Assignment

Let the eight phases of 8PSK be denoted by {0, 1, 2, 3, 4, 5, 6, 7}. Here m=3. Consider the 8PSK signal set A={0, 2; 4, 6}, and set B={1, 3, 5, 7}. For unit radius 8PSK constellation, the minimum intra-set square Euclidean distance for each set is 2. The minimum inter-set square Euclidean distances is 0.586.

Select the input label set $L_0$ as codewords of the (3, 2, 2) parity check code, i.e. $L_0$=[(000), (011), (101), (110)], next generate input label $L_1$=$L_0$+(001), i.e., $L_1$=[(001), (010), (100), (111)}. Consider a 2-state trellis. Assign the input-output pair ($L_o$, A) to four edges from state 0 to state 0. Assign the input-output pair ($L_1$, B) to four edges from state 0 to state 1. Next assign the input-output pair ($L_2$, A) to four edges from the state 1 to state 0, and assign the input-output pair ($L_3$, B) to four edges from state 1 to state 1. $L_2$ has the same elements as in $L_1$ but with different order, and $L_3$ has the same elements as in $L_0$ again with different order. In order to maximize the minimum Euclidean distance due to the input sequences with Hamming distance 2, we have to find the right permutation within each set. In this case it turns out that using the complement operation suffices. Therefore define input label $L_2$ as the complement of the elements of $L_0$ without changing the order, i.e., $L_2$=[(111), (100), (010), (001)]. Finally $L_3$ is generated in the same way, as the complement of elements in $L_1$, i.e. $L_3=[(110), (101), (011), (000)]$.

Such assignment guarantees that the squared effective free Euclidean distance of trellis code is 2, where the minimum squared Euclidean distance of the code is 0.586.

Having determined the code by its input labels and two-dimensional output signals, the encoder structure can then be obtained by selecting any appropriate labels (output labels) for the two-dimensional output signals. The following output mapping may be used: $\{(000), (001), (010), (011), (110), (111), (100), (101)]$, mapped to phases $[0, 1, 2, 3, 4, 5, 6, 7]$, which is called "reordered mapping". For this 2-state inner code, $d_{f,eff}^2=2$, and $h_m^{(3)}=\infty$, and $h_m^2=0.586$. The outer code for this example can be selected as a 4-state, rate $\frac{2}{3}$, convolutional code with $d_f^0=3$ (this is a recursive systematic rate $\frac{1}{2}$ convolutional code where the parity bits are punctured). Since $h_m^{(3)}=\infty$ then $d_f^0$ is increased effectively to 4. This method of design was used to obtain the encoders in the previous examples for 16QAM.

Figure 9:
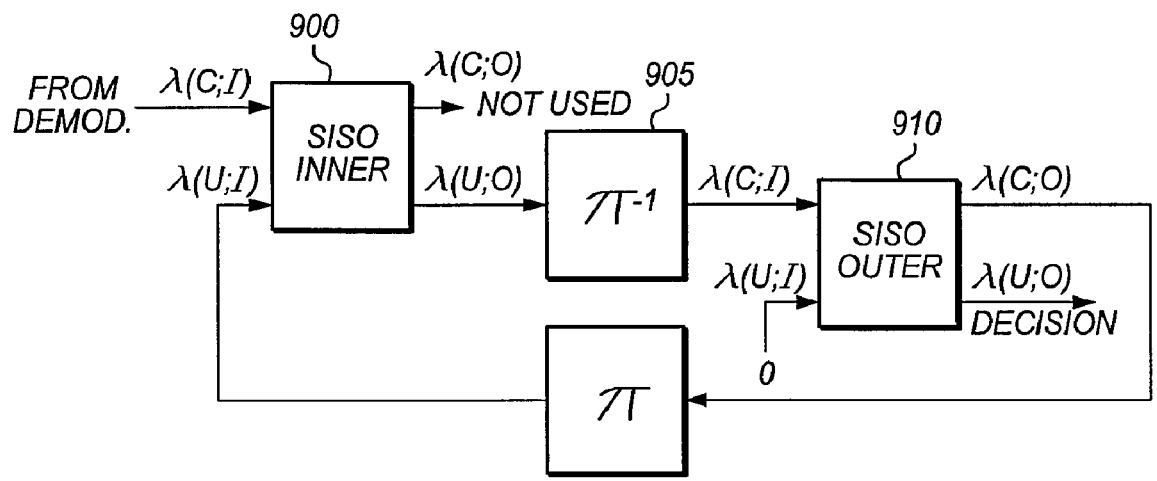
FIG. 9 shows a block diagram of an iterative decoder.

A decoder is described herein. This decoder can be a Bit-by-Bit Iterative Decoder. The iterative decoder for serially concatenated trellis coded modulation uses a generalized Log-APP (a-posteriori probability) decoder module with four ports, called SISO APP module or simply SISO. The block diagram of the iterative decoder for serial concatenated TCM is shown in FIG. 9. The device has a SISO inner decoder 900 coupled to a deinterleaver 905, an outer decoder 910. Feedback is passed through an interleaver 920 back to the inner decoder.

Figure 10:
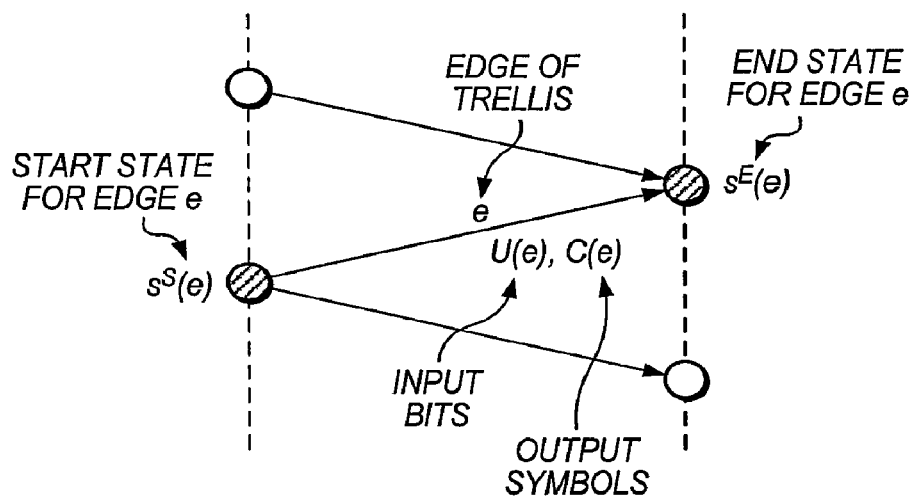
FIG. 10 shows a trellis diagram for the decoder.

The decoding techniques may be used for the inner TCM code and outer convolutional code, using the trellis section shown in FIG. 10. Consider an inner TCM code with $p_1$ input bits and $q_1$ nonbinary complex output symbols with normalized unit power, and an outer code with $p_2$ input bits and $q_2$ binary outputs $\{0,1\}$. Let $U_k(e)$ represent $u_{k,i}(e); i=1, 2, \ldots, p_m$ the input bits on a trellis edge at time k (m=1 for the inner TCM, and m=2 for the outer code), and let $c_k(e)$ represents $c_{k,i}(e); i=1, 2, \ldots, q_m$ the output symbols (m=1 for the inner TCM, with nonbinary complex symbols, and m=2 for the outer code with binary $\{0,1\}$ symbols).

Define the reliability of a bit Z taking values $\{0,1\}$ at time k as $$a = \log\left[\sum_{i=1}^{L} e^{a_i}\right] = \max_i\{a_1 \ldots, a_L\} \triangleq \max_i *\{a_i\}$$

The second argument in the brackets, shown as a dot, may represent I, the input, or O, the output, to the SISO. We use the following identity $$\lambda_k[z; \ldots] \triangleq \log\frac{P_k[Z=1;\cdot]}{P_k[Z=0;\cdot]}$$

where $\delta(a_1, \ldots, a_L)$ is the correction term which can be computed using a look-up table.

The "max*" operation is a maximization (compare/select) plus a correction term (lookup table). Small degradations occur if the "max*" operation is replaced by "max". The received complex samples $\{y_{k,i}\}$ at the output of the receiver matched filter are normalized such that additive complex noise samples have unit variance per dimension.

SISO can be used for the Inner TCM.
The forward and the backward recursions are:

$$\alpha_k(s) = \max_{e:s^E(e)=s} * \left\{ \begin{array}{l} \alpha_{k-1}[s^s(e)] + \\ \sum_{i=1}^{p_1} u_{k,i}(e)\lambda_k[U_{k,i}; I] + \\ \sum_{i=1}^{q_1} \overline{\lambda}_k[c_{k,i}(e); I] \end{array} \right\} + h_{\alpha_k}$$

$$\beta_k(s) = \max_{e:s^s(e)=s} * \left\{ \begin{array}{l} \beta_{k+1}[s^E(e)] + \\ \sum_{i=1}^{p_1} u_{k+1,i}(e)\lambda_{k+1}[U_{k+1,i}; I] + \\ \sum_{i=1}^{q_1} \overline{\lambda}_{k+1}[c_{k+1,i}(e); I] \end{array} \right\} + h_{\beta_k}$$

for all states s, and $k=1, \ldots, (n-1)$, where n represents the total number of trellis steps from the initial state to the final state. The extrinsic bit information for $U_{k,j}; j=1, 2 \ldots, p_1$ can be obtained from:

$$\lambda_k(U_{k,j}; O) = \max_{e:u_{k,j}(e)=1} * \left\{ \begin{array}{l} \alpha_{k-1}[s^s(e)] + \sum_{\substack{i=1\\i\neq j}}^{p_1} u_{k,i}(e)\lambda_k[U_{k,i}; I] + \\ \sum_{i=1}^{q_1} \overline{\lambda}_k[c_{k,i}(e); I] + \beta_k[s^E(e)] \end{array} \right\} -$$

$$\max_{e:u_{k,j}(e)=0} * \left\{ \begin{array}{l} \alpha_{k-1}[s^s(e)] + \sum_{\substack{i=1\\i\neq j}}^{p_1} u_{k,i}(e)\lambda_k[u_{k,j}; I] + \\ \sum_{i=1}^{q_1} \overline{\lambda}_k[c_{k,i}(e); I] + \beta_k[s^E(e)] \end{array} \right\}$$

where $$\overline{\lambda}_k[c_{k,i}(e); I] = -\left|y_{k,i} - \sqrt{\frac{2E_s}{N_0}} c_{k,i}(e)\right|^2 / 2.$$

We assume the initial and the final states of the inner encoder (as well as the outer encoder) are the all zero state. Forward recursions start with initial values, $a_0(s)=0$, if s=0 (initial zero state) and $a_0(s)=-\infty$, if $s\neq 0$. Backward recursions start with $\beta_n(s)=0$, if s=0 (final zero state) and $\beta_n(s)=-\infty$, if $s\neq 0$. The $h_{\alpha_k}$ and $h_{\beta_k}$ are normalization constants which, in the hardware implementation of the SISO, are used to prevent buffer overflow. These operations are similar to the Viterbi algorithm used in the forward and backward directions, except for a correction term that is added when compare-select operations are performed. At the first iteration, all $\lambda_k[U_{k,i}; I]$ are zero. After the first iteration, the inner SISO accepts the extrinsics from the outer SISO, through the interlayer n, as reliabilities of input bits of TCM encoder, and the external observations from the channel. The inner SISO uses the input reliabilities and observations for the calculation of new extrinsics $\lambda_k(U_{k,j}; O)$ for the input bits. These are then provided to the outer SISO module, through the deinterleaver $\pi^{-1}$. The forward and the backward recursions for SISO are:

$$\alpha_k(s) = \max_{e:s^E(e)=s} {}^* \left\{ \begin{array}{c} \alpha_{k-1}[s^s(e)] + \\ \sum_{i=1}^{q_2} c_{k,i}(e)\lambda_k[C_{k,i}; I] \end{array} \right\} + h_{\alpha_k}$$

$$\beta_k(s) = \max_{e:s^E(e)=s} {}^* \left\{ \begin{array}{c} \beta_{k+1}[s^E(e)] + \\ \sum_{i=1}^{q_2} c_{k+1,i}(e)\lambda_k[C_{k+1,i}; I] \end{array} \right\} + h_{\beta_k}$$

The extrinsic information for $C_{k,j}$; $j=1, 2 \ldots, q_2$, can be obtained from:

$$\lambda_k(U_{k,j}; O) = \max_{e:c_{k,j}(e)=1} {}^* \left\{ \begin{array}{c} \alpha_{k-1}[s^s(e)] + \\ \sum_{\substack{i=1 \\ i \neq j}}^{q_2} c_{k,i}(e)\lambda_k[C_{k,i}; I] + \beta_k[s^E(e)] \end{array} \right\} -$$

$$\max_{e:c_{k,j}(e)=0} {}^* \left\{ \begin{array}{c} \alpha_{k-1}[s^s(e)] + \\ \sum_{\substack{i=1 \\ i \neq j}}^{q_2} c_{k,i}(e)\lambda_k[C_{k,i}; I] + \beta_k[s^E(e)] \end{array} \right\}$$

with initial values, $a_0(s)=0$, if $s=0$ and $a_0(s)=-\infty$, if $s\neq 0$ and $\beta_n(s)=0$,
if $s=0$ and $\beta_n(s)=-\infty$, if $s\neq 0$, where $h_{\alpha_k}$ and $h_{\beta_k}$ are normalization constants which, in the hardware implementation of the SISO, are used to prevent the buffer overflow.

The final decision is obtained from the bit reliability computation of $U_{k,j}$; $j=1, 2 \ldots, p_2$, passing through a hard limiter, as $$\lambda_k(U_{k,j}; O) = \max_{e:u_{k,j}(e)=1} {}^* \left\{ \begin{array}{c} \alpha_{k-1}[s^s(e)] + \\ \sum_{i=1}^{q_2} c_{k,i}(e)\lambda_k[C_{k,i}; I] + \beta_k[s^E(e)] \end{array} \right\} -$$

$$\max_{e:u_{k,j}(e)=0} {}^* \left\{ \begin{array}{c} \alpha_{k-1}[s^s(e)] + \\ \sum_{i=1}^{q_2} c_{k,i}(e)\lambda_k[C_{k,i}; I] + \beta_k[s^E(e)] \end{array} \right\}$$

The outer SISO accepts the extrinsics from the inner SISO as input reliabilities of coded bits of the outer encoder. For the outer SISO there is no external observation from the channel. The outer SISO uses the input reliabilities for calculation of new extrinsics $\lambda_k(C_{k,j}; O)$ for coded bits. These are then provided to the inner SISO module.

Figure 11:
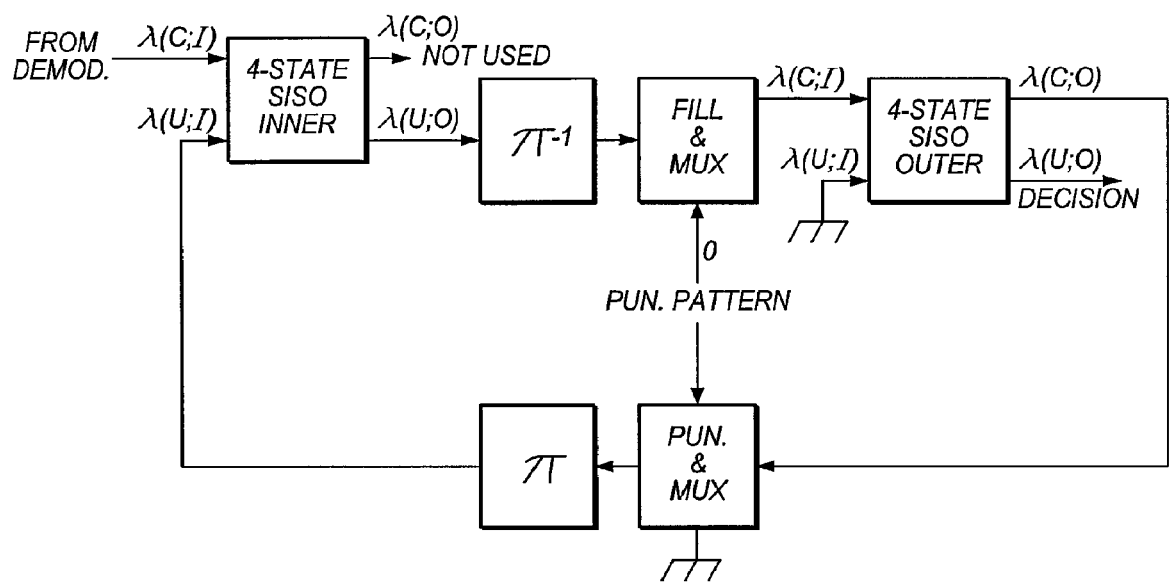
FIG. 11 shows a turbo coder with lower complexity.

The structure of iterative decoder for punctured outer code is shown in FIG. 11.

Other embodiments are within the disclosed invention.

The invention claimed is:

1. A method, comprising:
   receiving a set of input information, wherein the set of input information corresponds to a stream of symbols transmitted by an encoder system configured to perform a trellis coded modulation (TCM), wherein the TCM includes an inner encoding and a mapping, wherein the inner encoding encodes a first set of data to generate an intermediate set of data according to a rate 1 recursive code, wherein the mapping generates the stream of symbols from the intermediate set of data according to a first map, wherein the rate 1 recursive code and the first map maximize the effective free Euclidean distance of the inner encoding;
   performing a first SISO decoding operation on the set of input information to generate a first set of decoded information, wherein the first SISO decoding operation is for reversing the effects of the TCM encoding of the encoder system;
   generating a deinterleaved version of the first set of decoded information; and
   performing a second SISO decoding operation on the deinterleaved version of the first set of decoded information to generate a set of output information.

2. The method of claim 1, further comprising:
   generating, from the set of output information, an estimate of original data bits in the first set of data.

3. The method of claim 2, wherein performing the second SISO decoding operation also generates a first set of feedback information;
   wherein the method further comprises:
   interleaving the first set of feedback information to generate a second set of feedback information;
   repeating the first and second SISO decoding operations, wherein the repeated first SISO decoding operation uses the second set of feedback information and the repeated second SISO decoding operation uses a deinterleaved version of decoded information generated by the repeated first SISO decoding operation.

4. The method of claim 1, wherein the symbols of said stream are symbols of a quadrature amplitude modulation (QAM) constellation having $2^{2m}$ points, wherein m is greater than one.

5. The method of claim 1, wherein the symbols of said stream correspond to a phase shift keying (PSK) modulation having a constellation with $2^m$ points, wherein m is greater than one.

6. The method of claim 1, wherein the encoder system is configured to perform an outer encoding in addition to said TCM, wherein the outer encoding encodes original data bits to produce outer coded data, wherein the first set of data is an interleaved version of the outer coded data, wherein the second SISO decoding operation is based on the outer encoding.

7. The method of claim 6, wherein the outer encoding has rate b/(b+1), wherein b is an integer greater than or equal to one.

8. An apparatus, comprising:
   a inner SISO decoding unit configured to receive, at an input, input information and generate intermediate decode information therefrom, wherein the input information corresponds to a stream of symbols transmitted by an encoder system configured to perform a trellis coded modulation (TCM), wherein the TCM includes an inner encoding and a mapping, wherein the inner encoding encodes a first set of data to generate an intermediate set of data according to a rate 1 recursive code, wherein the mapping generates the stream of symbols from the intermediate set of data according to a first map, wherein the rate 1 recursive code and the first map maximize the effective free Euclidean distance of the inner encoding, wherein the inner SISO decoding unit is configured according to the TCM of the encoder system, and wherein the inner SISO decoding unit is configured to reverse the effects of the TCM encoding;
   a deinterleaver unit configured to generate a deinterleaved version of the intermediate decode information; and an outer SISO decoding unit configured to generate output information from the deinterleaved version of the intermediate decode information.

9. The apparatus of claim 8, wherein the apparatus is configured to generate, from the output information, an estimate of original data bits in the first set of data.

10. The apparatus of claim 9, wherein the outer SISO decoding unit is configured to generate feedback information, wherein the apparatus further comprises an interleaver unit configured to generate an interleaved version of the feedback information.

11. The apparatus of claim 10, wherein the inner SISO decoding unit and the outer SISO decoding unit are configured to generate the estimate by performing iterative decoding operations.

12. The apparatus of claim 11, wherein the inner SISO decoding unit is configured to generate subsequent sets of intermediate decode information from input information and interleaved versions of the feedback information.

13. The apparatus of claim 8, wherein the symbols of said stream are symbols of a quadrature amplitude modulation (QAM) constellation having $2^{2m}$ points, wherein m is greater than one.

14. The apparatus of claim 8, wherein the symbols of said stream correspond to a phase shift keying (PSK) modulation having a constellation with $2^m$ points, wherein m is greater than one.

15. The apparatus of claim 8, wherein the encoder system is configured to perform an outer encoding in addition to said TCM, wherein the outer encoding encodes original data bits to produce outer coded data, wherein the first set of data is an interleaved version of the outer coded data, wherein a SISO decoding operation performed by the outer SISO decoder unit is based on the outer encoding.

16. The apparatus of claim 15, wherein the outer encoding has rate b/(b+1), wherein b is an integer greater than or equal to one.

17. A decoding apparatus, comprising:
a first soft-input soft-output (SISO) module configured to receive input information corresponding to symbols transmitted by an encoding apparatus, wherein the encoding apparatus is configured to perform an outer encoding on source data in order to generate first intermediate source data, and to perform an inner trellis coded modulation (TCM) on an interleaved version of the first intermediate source data to generate the transmitted symbols, wherein the first SISO module is configured to compute intermediate decode information from the input information based on an inner trellis used by said inner TCM of the encoder system, and wherein the first SISO module is configured to reverse the effects of the TCM encoding; and
a second SISO module configured to compute output information from a deinterleaved version of the intermediate decode information based on an outer trellis used by the outer encoding of the encoding system;
wherein the inner TCM performed by the encoder system includes an inner encoding and a mapping, wherein the inner encoding encodes the interleaved version of the first intermediate source data to generate second intermediate source data according to a rate 1 recursive code, wherein the mapping generates the output symbols from the second intermediate source data according to a first map, wherein the rate 1 recursive code and the first map maximize the effective free Euclidean distance of the inner TCM.

18. The decoding apparatus of claim 17, further comprising:
an interleaver module; and
a deinterleaver module configured to generate the deinterleaved version of the intermediate decode information;
wherein the second SISO module is configured to generate feedback information from the deinterleaved version of the intermediate decode information; and
wherein the interleaver module is configured to generate an interleaved version of the feedback information, and wherein the first SISO module is further configured to generate the intermediate decode information from the interleaved version of the feedback information.

19. The decoding apparatus of claim 18, wherein the inner trellis is a 4-state trellis.

20. The decoding apparatus of claim 18, wherein the inner trellis is a 2-state trellis.

* * * * *

UNITED STATES PATENT AND TRADEMARK OFFICE
CERTIFICATE OF CORRECTION

PATENT NO.       : 8,086,943 B2
APPLICATION NO.  : 12/848889
DATED            : December 27, 2011
INVENTOR(S)      : Divsalar et al.

It is certified that error appears in the above-identified patent and that said Letters Patent is hereby corrected as shown below:

Title page 2, in Field (56), under "OTHER PUBLICATIONS", in Column 2,
Line 49, delete "Multipat h" and insert -- Multipath --, therefor.

In Column 2, Line 42, delete "complexity:" and insert -- complexity. --, therefor.

In Column 4, Lines 22-24, delete "A ½ .... modulation.".

In Column 5, Line 2, delete "decoder" and insert -- decoder. --, therefor.

In Column 5, Line 22, delete "the minimum" and insert -- is the minimum --, therefor.

In Column 5, Line 27, delete "$E_s/N_o$," and insert -- $E_s/N_0$ --, therefor.

In Column 5, Line 50, delete "z'pairs," and insert -- z' pairs, --, therefor.

In Column 6, Line 55, delete "$(L_o,A)$" and insert -- $(L_0,A)$ --, therefor.

In Column 7, Lines 48-49, delete "$a = \log[\sum_{i=1}^{L} e^{a_i}] = \max_i\{a_1,...,a_L\} \underline{\Delta} \max^*_i\{a_i\}$" and
insert -- $\lambda_k[z;...] \underline{\Delta} \log \frac{P_k[Z=1;\cdot]}{p_k[Z=0;\cdot]}$ --, therefor.

Signed and Sealed this
Tenth Day of July, 2012

David J. Kappos
*Director of the United States Patent and Trademark Office*

CERTIFICATE OF CORRECTION (continued)
U.S. Pat. No. 8,086,943 B2

In Column 7, Lines 58-59, delete " $\lambda_k[z;...] \underline{\Delta} \log \frac{P_k[Z=1;\cdot]}{p_k[Z=0;\cdot]}$ ," and insert -- $a = \log[\sum_{i=1}^{L} e^{a_i}] = \max_i \{a_1,..,a_L\} \underline{\underline{\Delta}} \max_i^* \{a_i\}$ --, therefor.

In Column 8, Line 25, delete "2" and insert -- 2, --, therefor.

In Column 8, Lines 29-30, delete " $\sum_{\substack{i=1 \\ 1 \neq j}}^{P_1}$ " and insert -- $\sum_{\substack{i=1 \\ i \neq j}}^{P_i}$ --, therefor.

In Column 8, Line 63, delete "interlayer n," and insert -- interleaver π, --, therefor.

In Column 9, Line 15, delete "2" and insert -- 2, --, therefor.

In Column 9, Line 36, delete "2" and insert -- 2, --, therefor.